(12) United States Patent
Shive et al.

(10) Patent No.: US 7,084,048 B2
(45) Date of Patent: Aug. 1, 2006

(54) PROCESS FOR METALLIC CONTAMINATION REDUCTION IN SILICON WAFERS

(75) Inventors: Larry W. Shive, St. Charles, MO (US); Brian L. Gilmore, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 10/840,854

(22) Filed: May 7, 2004

(65) Prior Publication Data

US 2005/0250297 A1     Nov. 10, 2005

(51) Int. Cl.
*H01L 21/322* (2006.01)
(52) U.S. Cl. .................. 438/476; 438/58; 438/143; 438/210; 438/402
(58) Field of Classification Search ................ 438/694, 438/906, 471, 476, 58, 143, 210, 402, FOR. 144
See application file for complete search history.

(56) References Cited

U.S. PATENT DOCUMENTS

| | | | |
|---|---|---|---|
| 6,100,167 A | | 8/2000 | Falster et al. |
| 6,194,327 B1 * | | 2/2001 | Gonzalez et al. ............ 438/770 |
| 6,562,733 B1 * | | 5/2003 | Horikawa .................... 438/787 |
| 2003/0104680 A1 | | 6/2003 | Stefanescu et al. |

FOREIGN PATENT DOCUMENTS

| | | |
|---|---|---|
| DE | 3939661 A1 | 6/1991 |
| JP | 60055629 | 3/1985 |
| JP | 63129633 | 6/1988 |

OTHER PUBLICATIONS

Ghandhi, Sorab K., VLSI Fabrication Principles, Silicon and Gallium Arsenide, 1983 by John Wiley and Sons, pp. 517-519.*
Abe, A History and Future of Silicon Crystal Growth, Electrochem. Soc. Proceed., vol. 98-1, pp. 157-178, 1998.
Adachi, et al., Reduction of Growth-In Defects by High Temperature Annealing, J. Electrochem. Soc., vol. 147, No. 1, pp. 350-353, 2000.

(Continued)

*Primary Examiner*—George Fourson
*Assistant Examiner*—Julio J. Maldonado
(74) *Attorney, Agent, or Firm*—Senniger Powers (57) ABSTRACT

A process for removing a contaminant selected from among copper, nickel, and a combination thereof from a silicon wafer having a surface and an interior. The process comprises cooling the silicon wafer in a controlled atmosphere from a temperature at or above an oxidation initiation temperature and initiating a flow of an oxygen-containing atmosphere at said oxidation initiation temperature to create an oxidizing ambient around the silicon wafer surface to form an oxide layer on the silicon wafer surface and a strain layer at an interface between the oxide layer and the silicon wafer interior. The cooling of the wafer is also controlled to permit diffusion of atoms of the contaminant from the silicon wafer interior to the strain layer. Then the silicon wafer is then cleaned to remove the oxide layer and the strain layer, thereby removing said contaminant having diffused to the strain layer.

41 Claims, 1 Drawing Sheet

OTHER PUBLICATIONS

Graf, et al., Improvement of Czochralski Silicon Wafers by High-Temperature Annealing, J. Electrochem. Soc., vol. 142, No. 9, pp. 3189-3192, 1995.

Graf, et al., Characterization of Crystal Quality by Crystal Originated Particle Delineation and the Impact on the Silcon Wafer Surface, J. Electrochem. Soc., vol. 145, No. 1, pp. 275-283, 1998.

Iida, et al., Effects of Light Element Impurities on the Formation of Grown-In Defects Free Region of Czochralski Silcon Single Crystal, Electrochem. Soc. Proceed., vol. 99-1, pp. 499-510, 1999.

Ingle & Crouch, Spectrochemical Analysis, Prentice Hall, pp. 577-590, 1988.

Neumann, et al., Ultra-Trace Analysis of Metallic Contaminations on Silicon Wafer Surfaces by Vapour Phase Decomposition/Total Reflection X-Ray Fluoresence, Spectrochimica Acta, vol. 46B, No. 10, pp. 1369-1377, 1991.

Shimura, Semiconductor Silicon Crystal Technology, Academic Press, Inc. pp. 188-191 & Appendix XII, 1989.

Silicon Chemical Etching, J. Grabmaier, Springer-Verlag, New York, pp. 3-19, 1982.

Tamatsuka, et al., Oxide Defect Annihilation/Generation Following High Temperature Annealing: A Gate Oxide Integrity Evaluation, Electrochem. Soc. Proceed., vol. 97-3, pp. 183-194, 1997.

Verhaverbeke, et al., The Effect of $H_2$ Annealing on the SI Surface and its Use in the Study of Roughening During Wet Chemical Cleaning, Electrochem. Soc. Proceed., vol. 93-8, pp. 1170-1181, 1993.

Vanhellemont, et al., On the Nature of Grown-In Defects in Silicon: Dependence on Pulling Conditions and Evolution During Thermal Treatments, Electrochem. Soc. Proceed., vol. 96-13, pp. 226-237.

Tamatsuka, et al., High Performance Silicon Wafer with Wide Grown-In Void Free Zone and High Density Internal Gettering Site Achieved Via Rapid Crystal Growth with Nitrogen Doping and High Temperature Hydrogen and/or Argon Annealing, Electrochemical Society Proceedings, May 1999, vol. 99, No. 1, pp. 456-467.

Bai, et al., Intrinsic Cu Gettering at a Thermally Grown $SiO_2$/Si Interface, J. Appln. Phys., vol. 68, No. 7 Oct. 1990, pp. 3313-3316.

Hozawa, et al., Copper Distribution Near a $SiO_2$/Si Interface Under Low-Temperature Annealing, Japanese J. Appl. Phys., vol. 41, No. 10, Oct. 2002, pp. 5887-5893.

* cited by examiner

PROCESS FOR METALLIC CONTAMINATION REDUCTION IN SILICON WAFERS

BACKGROUND OF THE INVENTION

The present invention generally relates to the preparation of semiconductor material substrates, especially silicon wafers, which are used in the manufacture of electronic components. More particularly, the present invention relates to a process for thermally treating or annealing one or more silicon wafers to reduce the concentration of metal contaminants such as copper from the wafer interior or bulk. Additionally, the process of the present invention may be performed in a manner that reduces the concentration or size of agglomerated vacancy defects on the surface and in the bulk of one or more silicon wafers.

Silicon device performance is degraded by metallic contaminants. Transition metals, including copper, iron and nickel, may dissolve and diffuse during the normal thermal cycles associated with integrated circuit manufacturing conditions. While cooling from the temperatures associated with integrated circuit manufacturing, copper and other metals may precipitate or concentrate at the surface of the wafer, as well as at interfaces, defect sites, and regions that are doped with, for example, boron (e.g., p-type wafers or regions). These precipitates are generally believed to be the reaction of product the contaminant metals and silicon. In the case of copper, they are believed to be copper silicide precipitates. The precipitates often result in the formation of dislocations and other defects. The precipitates and their associated dislocations and defects, if present in the device fabrication region of the wafer, may render integrated circuits prepared from the wafer useless. Additionally, copper silicide precipitates may form what are referred to as haze defects because, upon being subjected to a common etching treatment and bright light inspection, the precipitates cause defects that appear as a haze on the surface of the wafer. Because of these problems, integrated circuit manufacturers generally require that the concentration of copper on the surface of a silicon wafer be no more than $1 \times 10^{10}$ atoms/cm$^2$ to $1 \times 10^{11}$ atoms/cm$^2$, as determined by methods standard in the art. Further, it is foreseeable that this requirement will be decreased to a value of $5 \times 10^9$ atoms/cm$^2$, $1 \times 10^9$ atoms/cm$^2$ or less since a large fraction of random device failures can be traced to copper silicide precipitates.

Single crystal silicon wafers are commonly manufactured by a process which starts with the growth of a monocrystalline silicon ingot produced by the Czochralski method or the float-zone method. The crystal ingot is typically sliced into wafers with a wire-saw, the wafers are flattened by lapping and chemically etched to remove mechanical damage and contamination. After being etched, the wafers are polished on one or both sides. Although the wafers may undergo additional processing such as thermal annealing to reduce crystal originated particles, the processing typically ends with state of the art cleaning methods. After such a cleaning, the copper concentration on the surface of polished wafers is typically less than $1 \times 10^{10}$ atoms/cm$^2$, as determined by total reflection spectroscopy (TXRF) measurements. See, e.g., C. Neumann et al., *Spectrochemica Acta*, 10 (1991), pp. 1369–1377; and Ingle & Crouch, *Spectrochemical Analysis*, Prentice Hall, 1988. The surface copper concentration of these wafers, however, tends to increase with the passage of time even at room temperature until saturation is reached. Thus, wafers which meet a target specification for surface copper concentration immediately after cleaning may fail to meet this specification as soon as five to ten months later.

To date, there have been three main approaches to dealing with the problem of copper contamination of silicon wafers. The first approach includes reducing the amount of copper and other metals that are introduced into the silicon during the polishing operation. Specifically, the industry has primarily focused its attention on identifying and eliminating, to the extent possible, the sources of these contaminants. In addition to reducing the amount of metals in polishing mixtures, other methods such as that disclosed by Prigge et al. (DE 3939661 A1) include limiting the amount copper actually incorporated into the wafer during polishing by admixing with polishing agents certain reagents which form a coordination complex with copper. This coordination complex acts to maintain the copper in a specific conformation which limits the ability of copper to enter the silicon. Although modifying polishing mixtures have tended to reduce the degree of copper contamination in silicon wafers, it typically has not been sufficiently effective to negate the need for other copper reduction methods. Additionally, the ever more stringent limitations being placed upon metallic contaminant levels in silicon wafers by integrated circuit manufactures makes relying on polishing mixture modifications a significantly more costly option for controlling metallic contamination in silicon wafers.

The second approach for dealing with the metal contamination of polished silicon wafers is intrinsic gettering to trap copper and other metals and prevent these metals from reaching the device region of the wafer. Intrinsic gettering techniques involve introducing defect sites into the silicon wafer at locations which do not disturb the functioning of integrated circuits fabricated from the wafer (i.e., a region of the wafer interior below the device region often referred to as the "bulk", the "wafer bulk", or the "bulk region"). Gettering techniques, however, have not proven to be an entirely acceptable solution for controlling metallic contaminants. For example, the high diffusivity of metals such as copper and nickel in silicon enables these metals to escape from gettering sites and reach the device region. Additionally, it is possible for the defects introduced into silicon as gettering sinks to reduce the quality of silicon by, for example, reducing minority carrier recombination lifetime.

The third approach for dealing with the problem of metallic contamination of polished silicon wafers is the use of one or more so-called "low temperature anneals" to drive copper from the bulk of a silicon wafer to the surface where it can be removed. For example, Falster et al., U.S. Pat. No. 6,100,167 disclose a process which generally involves subjecting a wafer to a low temperature anneal (e.g., between about 225 and about 300° C.) for a relatively short period of time (e.g., between about 5 minutes and about 1.5 hours) to increase the rate at which copper diffuses to the surface of the wafer. After diffusing to the surface, the copper is removed from the surface by performing a cleaning operation. One or more of these low-temperature anneals, including cleanings to remove the copper, may be performed before a polished silicon wafer is heated to a temperature in excess of 500° C. in order to avoid the formation of copper silicide precipitates. Although these low-temperature anneals may be used to effectively remove copper from a single silicon wafer, they have not been implemented in a typical manufacturing process because they would significantly decrease throughput and would greatly increase the cost of a wafer. For this reason, these low-temperature anneals have been limited to laboratory and testing applications.

In summary, the manufacture of silicon wafers involves a number of steps which are potential sources for the introduction of metallic contaminants, such as wafer polishing. And, in view of the shortcomings of the foregoing methods for preventing or removing the metallic contamination, a need continues to exist for a simple, low-cost, and effective method for removing metallic contaminants from polished silicon wafers that can be incorporated into conventional manufacturing processes without forming harmful precipitates.

BRIEF SUMMARY OF THE INVENTION

Briefly, therefore, the present invention is directed to a process for removing a contaminant selected from among copper, nickel, and a combination thereof from a silicon wafer having a silicon wafer surface and a silicon wafer interior. The process comprises cooling the silicon wafer in a controlled atmosphere from a temperature at or above an oxidation initiation temperature. At said oxidation initiation temperature, a flow of oxygen-containing atmosphere is initiated to create an an oxidizing ambient around the silicon wafer surface to form an oxide layer on the silicon wafer surface and a strain layer at an interface between the oxide layer and the silicon wafer interior. The cooling of the silicon wafer is controlled to permit diffusion of atoms of the contaminant from the silicon wafer interior to the strain layer. The wafer is then cleaned to remove the oxide layer and the strain layer, thereby removing said contaminant having diffused to the strain layer.

The present invention is also directed to another process for a process for removing a contaminant selected from among copper and nickel from a silicon wafer having a silicon wafer surface and a silicon wafer interior. This process comprises heating the silicon wafer to a temperature of at least about 1100° C. and exposing the silicon wafer surface to a cleaning ambient that comprises selected from the group consisting of hydrogen, helium, neon, argon, krypton, xenon, and mixtures thereof to remove silicon oxide from the silicon wafer surface to thereby yield a deoxidized silicon wafer. The deoxidized silicon wafer is exposed to an oxidizing ambient to form an oxide layer on the silicon wafer surface to thereby yield an oxidized silicon wafer having a strain layer at an interface between the oxide layer and the silicon wafer interior. The temperature of the oxidized silicon wafer is controlled to diffuse contaminant from the silicon wafer interior to the strain layer. The silicon wafer is then cleaned to remove the contaminant that diffused to the strain layer from the silicon wafer thereby yielding a cleaned silicon wafer.

The present invention is further directed to a process for process for removing a contaminant selected from among copper, nickel, and a combination thereof from a multiplicity of silicon wafers having silicon wafer surfaces and silicon wafer interiors. The process comprises cooling the silicon wafers from a temperature at or above an oxidation initiation temperature, wherein the oxidation initiation temperature is less than about 800° C. At said oxidation initiation temperature, a flow of an oxygen-containing atmosphere is initiated to create an oxidizing ambient around the silicon wafers surfaces to form oxide layers that are between about 5 and about 20 Å thick on the silicon wafer surfaces and strain layers at interfaces between the oxide layers and the silicon wafer interiors. The cooling of the wafers is controlled to permit diffusion of atoms of the contaminant from the silicon wafer interiors to the strain layers. Then the silicon wafers are cleaned to remove the oxide layers and the strain layers, thereby removing said contaminant having diffused to the strain layers.

Additionally, the present invention is directed to a process for process for removing a contaminant selected from among copper, nickel, and a combination thereof from a silicon wafer having a silicon wafer surface and a silicon wafer interior. The process comprises increasing the temperature of the silicon wafer to an annealing temperature that is at least about 1100° C. while exposing the silicon wafer to a heating-cooling ambient comprising argon. The silicon wafer is annealed by exposing the silicon wafer to an annealing ambient selected from the group consisting of hydrogen, helium, neon, argon, krypton, xenon, and combinations for a duration that is between about 30 minutes and about 90 minutes as the silicon wafer is at the annealing temperature to remove silicon oxide from the silicon wafer surface and to facilitate the migration of silicon atoms to exposed agglomerated vacancy defects at the silicon wafer surface thereby reducing the size of the exposed agglomerated vacancy defects. The temperature of the silicon wafer is decreased from the annealing temperature to an oxidation initiation temperature that is no greater than about 800° C. while exposing the silicon wafer to the heating-cooling ambient. As the temperature of the wafer is decreased from the oxidation initiation temperature, the silicon wafer is exposed to an oxidizing ambient comprising oxygen at a concentration that is between about 10 and about 100 ppm to form an oxide layer on the silicon wafer surface and a strain layer at an interface between the oxide layer and the silicon wafer interior. The temperature decrease of the silicon wafer is controlled to permit diffusion of atoms of the contaminant from the silicon wafer interior to the strain layer. The silicon wafer is cleaned to remove the contaminant that diffused to the strain layer from the silicon wafer.

Other features and advantages of the present invention will become more apparent from the following description and accompanying drawing(s).

DETAILED DESCRIPTION OF THE INVENTION

The following discussion focuses on copper contamination in silicon; copper being the most studied and typically the most problematic of the metallic contaminants. The methods described herein with respect to copper, however, are also applicable to other metallic contaminants found in silicon (e.g., nickel, iron, aluminum, chromium, etc).

Without being bound to any particular theory, it is believed that copper forms some sort of complex with boron and is incorporated or "stored" in this form in boron-doped silicon wafers. It is additionally believed that these copper-boron complexes are metastable, even at room temperature. As time passes, therefore, these complexes dissociate allowing copper to assume an interstitial position. Copper is a rapid diffuser in silicon; the most rapid of all metals and is very mobile even at room temperature. In addition, however, its solubility in silicon is strongly temperature dependent and at low temperatures, e.g., room temperature, it is very low. At low temperatures, therefore, interstitial copper tends to rapidly diffuse to the surface of the wafer. As such, the concentration of copper on the surface of a wafer tends to increase overtime until some surface concentration limit (e.g., the saturation limit) is reached. In addition to being time dependent, the diffusion of copper to the surface depends, in part, upon the amount of copper contributed to the wafer by the polishing process and/or other sources such as carbon and silicon carbide containing furnace parts and furniture. Still further, the degree of copper diffusion depends, in part, upon the concentration of boron in a wafer. Specifically, as the boron concentration of the wafer increases, the "storage" capacity for copper increases and, as such, the potential for a time-dependent increase in the copper concentration on the wafer surface increases.

The relative amount of copper contamination in the bulk of a silicon wafer may be evaluated by performing a test that accelerates the diffusion of copper from the wafer bulk to the surface of the wafer, where it may be removed and measured. One such method includes a low temperature heat treatment of the wafer at a temperature of at least about 75° C. for at least about 30 seconds to outdiffuse copper in the wafer bulk to the polished surface, a silicon oxide layer thereon, and/or within a region of strained silicon extending inward from the polished surface a distance of few nanometers (e.g., less than about 100 nm). Without being bound to a particular theory, it is believed that the strain region or layer at or near the surface is primarily caused by lattice differentiation (i.e., at the interface where silicon is changing to a silicon oxide such as SiO and $SiO_2$ because volumetrically larger silicon oxide is being forced into the space previously occupied by the smaller silicon phase, which causes compression and strain). It is also possible that some portion of the strain may be the result of the difference between coefficients of expansion of the silicon and the silicon oxide thereon, which when the temperature of the wafer is changed causes thermally induced stress and strain. Preferably, the low temperature heat treatment comprises heating the wafer to a temperature that is about 250° C. for a duration that is about four hours. The heat treated wafer is then subjected to a test to measure the amount of outdiffused copper. An example of such a test is acid-drop/ICP-MS (inductively coupled plasma-mass spectroscopy), which entails contacting the surface of the wafer with a chemical solution (e.g., a hydrofluoric acid based mixture) to extract the copper by dissolving oxide and copper from the surface, collecting the solution containing the dissolved oxide and copper, and measuring the amount of copper in the solution using ICP-MS. The measured amount of copper is converted to a copper concentration expressed in a number of atoms per square centimeter of the wafer surface and is generally referred to as the "bulk concentration of copper", "bulk copper concentration", or "bulk copper". When measured according to the foregoing method, many integrated circuit manufactures require that the bulk copper concentration be less than $5\times10^{10}$ atoms/cm$^2$ and preferably less than $1\times10^{10}$ atoms/cm$^2$.

Although polished and cleaned wafers may have acceptable surface concentrations of copper (i.e., the concentration of copper on the surface before performing a bulk concentration measurement) that are within integrated circuit manufacturer specifications, they may have bulk concentrations of copper exceeding about $5\times10^{10}$ atoms/cm$^2$, exceeding about $1\times10^{11}$ atoms/cm$^2$, or exceeding about $1.5\times10^{11}$ atoms/cm$^2$. For example, P-type wafers analyzed for bulk copper content, after being polished and annealed at high temperatures such as 1200° C. to reduce or eliminate crystallographic defects, typically have bulk copper concentrations of about $2\times10^{11}$ atoms/cm$^2$.

In general, the process of the present invention is directed to removing metallic contaminants from the bulk of one or more silicon wafers. More specifically, the present invention is directed to a thermal treatment or an anneal that comprises heating one or more wafers that contain metallic contaminants to a relatively high temperature (e.g., at least about 500° C., 600° C., 700° C., 800° C., 900° C., 1000° C., 1100° C., or 1200° C., or even higher) and then cooling the wafers in such a manner so as to allow the metallic contaminants, especially copper, to diffuse to a strain region at or near the surface of the wafer. The diffused metallic contaminants may then be removed from the wafers by cleaning the wafers according to any appropriate cleaning method such as a conventional SC1, SC2 cleaning operation. Without being held to a particular theory, it is believed that subjecting boron-doped silicon single crystal wafers to the foregoing process increases the rate at which copper-boron complexes dissociate and increases the rate at which copper diffuses from the bulk of the wafer to a strain region at or near the surface where the diffused copper preferably resides until being removed from the wafer. By increasing the dissociation and diffusion rates, a significant portion of the copper previously in the bulk of the wafer may be removed. In fact, after removing the diffused copper, the extent of the copper in the wafer is such that the bulk concentration of copper in the wafer is reduced to a level below about $1\times10^{10}$ atoms/cm$^2$. Preferably, the bulk concentration of copper is reduced to a level below about $5\times10^{9}$ atoms/cm$^2$. More preferably, the bulk concentration of copper is reduced to a level below about $1\times10^{9}$ atoms/cm$^2$.

Advantageously, the reduction in bulk copper concentration may be achieved while adding little or even no time to the manufacturing process because the process of the present invention may be incorporated into the cool-down portion of a conventional heat treatment such as a hydrogen and/or argon anneal (also referred to as a "hydrogen-argon anneal") performed to reduce or eliminate agglomerated vacancy defects such as those that appear as octahedral voids and are commonly referred to as crystal originated pits/particles (also referred to as "COPs"). In fact, the method of the present invention is particularly suited for incorporation during the cool-down portion of a hydrogen-argon anneal and, as such, the following description of the invention is primarily directed to such an embodiment. Another advantage of the present invention is that it may be performed at essentially no additional cost because very little of a relatively inexpensive raw material (e.g., oxygen) is used. Also, the present invention allows for the removal of copper without the modification of conventional post-anneal cleaning processes.

Characteristics of the Silicon Wafer

The preferred starting material for the present invention preferably is a single crystal silicon wafer which has been sliced from a single crystal ingot grown in accordance with any of the conventional variations of the Czochralski crystal growing method. A wafer prepared using the Czochralski method typically has an oxygen concentration anywhere from about $5\times10^{17}$ atoms/cm$^3$ to about $9\times10^{17}$ atoms/cm$^3$ (in other words, from about 10 ppm to about 18 ppm (i.e., from about 10 to about 18 oxygen atoms per 1,000,000 total atoms in the wafer)) (ASTM standard F-121-80), and more typically from about $6\times10^{17}$ atoms/cm$^3$ to about $8.5\times10^{17}$ atoms/ cm$^3$ (i.e., from about 12 ppm to about 17 ppm). If a wafer that is free of oxygen is desired, the starting material is preferably sliced from a single crystal ingot grown in accordance with any of the conventional variation of the float-zone crystal growing method. Growing a silicon ingot, as well as standard silicon slicing, lapping, etching, and polishing techniques, are well known in the art and disclosed, for example, in F. Shimura, *Semiconductor Silicon Crystal Technology* (Academic Press, 1989); and *Silicon Chemical Etching*, (J. Grabmaier, ed., Springer-Verlag, New York, 1982). The method of the present invention is preferably performed on one or more silicon wafers at any point in the manufacturing process after a final polishing operation that produces a specular gloss on at least the front surface of the silicon wafer, but before the final cleaning operation.

The wafer typically contains one or more dopants to give the wafer various desired properties. Specifically, the wafer is tyipcally a P-type wafer (i.e., a wafer that has been doped with an element from Group 3 of the Periodic Table such as boron, aluminum, gallium and indium, most typically boron). Preferably, the wafer is a P-type wafer having a resistivity of from about 100 Ω-cm to about 0.01 Ω-cm. For boron-doped silicon, the foregoing resistivity values correspond to a dopant concentration of about $1.3 \times 10^{14}$ atoms/cm$^3$ to about $8.5 \times 10^{18}$ atoms/cm$^3$, respectively. Although the process of the present invention is useful for removing copper from P-type wafers with relatively low concentrations of boron which have resistivities, for example, between about 20 Ω-cm and about 1 Ω-cm (generally referred to as P-silicon), the copper removal is particularly beneficial for wafers containing higher boron concentrations having resistivities, for example, between about 0.03 Ω-cm and about 0.01 Ω-cm (generally referred to as "P+-silicon").

Preferably, the wafer also comprises nitrogen. The presence of nitrogen provides several benefits to a silicon wafer. Specifically, it is known by those of skill in the art that nitrogen strengthens a silicon wafer. Additionally, presence of nitrogen tends to slow the diffusion of vacancy defects in silicon which may reduce the concentration and/or size of voids in the wafer; smaller voids tend to dissolve more readily when the wafer is subjected to an appropriate thermal process. The slowing of vacancy diffusion also tends to stabilize the density or concentration of oxygen precipitates or bulk micro defects (also referred to as "BMD" or BMDs") in the wafer. Methods of controlling the concentration of nitrogen in a growing silicon ingot are well known in the art. Preferably, any known method may be used to control the concentration of nitrogen in a growing ingot so that a wafer sliced therefrom has a concentration that is of nitrogen that is between about $1 \times 10^{12}$ atoms/cm$^3$ (about 0.00002 ppma) and $1 \times 10^{15}$ atoms/cm$^3$ (about 0.02 ppma). More preferably, the concentration of nitrogen is between about $1 \times 10^{12}$ atoms/cm$^3$ and about $1 \times 10^{13}$ atoms/cm$^3$ (0.0002 ppma).

Figure 1:
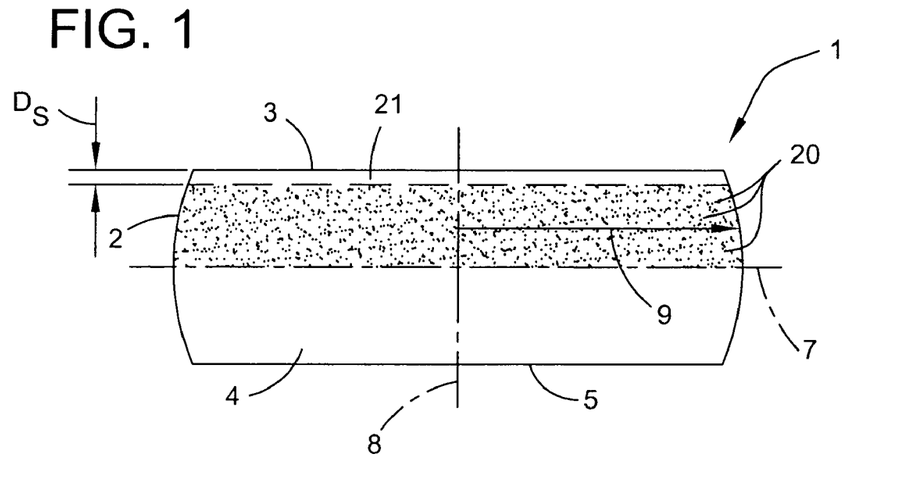
FIG. 1 shows the structure of a single crystal silicon wafer produced in accordance with the present invention.

Referring to FIG. 1, the single crystal silicon wafer has a central axis 8, a front surface 3, and a back surface 5 which are generally perpendicular to the central axis 8, an imaginary central plane 7 which is equidistant between the front and back surfaces, a circumferential edge 2 joining the front surface 3 and the back surface 5 and a radius 9 extending from the central axis to the circumferential edge 2. It should be noted that because silicon wafers typically have some total thickness variation (TTV), warp, and bow, the midpoint between every point on the front surface and every point on the back surface may not precisely fall within a plane. As a practical matter, however, the total thickness variation, warp, and bow are typically so slight that to a close approximation the midpoints can be said to fall within the imaginary central plane.

Annealing to Improve Surface Properties of Silicon Wafers

A polished wafer typically has undesirable defects (e.g., COPs) on the surface that were formed as the ingot cooled after solidification which are detectable by laser scatter inspection tools. Such defects arise, in part, due to the presence of an excess (i.e., a concentration above the solubility limit) of intrinsic point defects, which are known as vacancies and self-interstitials. Silicon crystals grown from a melt are typically grown with an excess of one or the other type of intrinsic point defect, either crystal lattice vacancies or silicon self-interstitials. Agglomerated intrinsic point defects in silicon can severely impact the yield potential of the material in the production of complex and highly integrated circuits. For example Gate Oxide Integrity failures correlate to the concentration of COPs on the wafer surface. D. Graf, M. Suhren, U. Schmilke, A. Ehlert, W. v. Ammon and P. Wagner., *J. Electrochem. Soc.* 1998, 145, 275; M. Tamatsuka, T. Sasaki, K. Hagimoto and G. A. Rozgonyi, Proc. 6th. Int. Symp. On Ultralarge Scale Integration Science and Technology "ULSI Science and Technology/ 1997," *The Electrochemical Society* 1997, PV 97-3, p. 183; and T. Abe, *Electrochem. Soc. Proc.* 1998, PV 98-1, 157; N. Adachi, T. Hisatomi, M. Sano, H. Tsuya, *J. Electrochem. Soc.* 2000, 147, 350.

At the surface of a wafer, COPs appear as pits with silicon dioxide covered walls and are typically about 50–300 nm wide and can be up to about 300 nm deep. It is presently believed that heat treating a wafer in certain ambients increases the migration of silicon atoms to the COPs which decreases the depth of the COPs until they appear as shallow dish-like depressions that are not usually detected by automated inspection tools. Previously disclosed heat treatments, or thermal annealing processes, include long term annealing in a hydrogen atmosphere (e.g., longer than about 30 minutes) which produces virtually COP-free surfaces. D. Graf, U. Lambert M. Brohl, A. Ehlert, R. Wahlich, P. Wagner., *J. Electrochem. Soc.* 1995, 142, 3189. Annealing a wafer in an argon ambient has also been disclosed. D. Graf, M. Suhren, U. Lambert, R. Schmolke, A. Ehlert, W. v. Ammon and P. Wagner, *Electrochem. Soc. Proc.* 1996, 96-13, 117; Iida, W. Kusaki, M. Tamatsura, E. Iino, M. Kimura and S. Murasoka, *Electrochem. Soc. Proc.* 1999, 99-1, 449. Additionally, annealing wafers in a mixture of $H_2$ and Ar has also been attempted for surface COP annihilation and GOI improvement with similar increases in the haze. T. Abe, *Electrochem. Soc. Proc.* 1998, 98-1, 157; M. Tamatsuka, N. Kobayashi, S. To be, and T. Masiu, *Electrochem. Soc Proc,* 1999, 99-1, 456); D. Graf, M. Suhren, U. Lambert, R. Schmolke, A. Ehlert, W. v. Ammon, and P. Wagner, *Electrochem. Soc. Proc.* 1996, 96-13, 117; and W. Iida, M. Kusaki, E. Tamatsura, M. K. Iino, S. Muraoka, *Electrochem. Soc. Proc.* 1999, 99-1, 449. It is important to note that it is believed that the process for removing copper of the present invention may be incorporated into essentially any thermal treatment for eliminating COPs located on the surface and in the bulk of a wafer (e.g., a region extending from the surface inward a depth of at least about 10 μm).

Anomalies on the surface of the silicon wafer, regardless of whether they are particles (e.g., polishing grit), agglomerated interstitial defects, or agglomerated vacancy defects (e.g., COPs) are typically detected with laser scatter inspection tools. Examples of suitable commercially available laser scatter inspection tools include the SURFSCAN 6220 and the SURFSCAN SP1 from KLA-Tencor of Mountain View, Calif., U.S.A. and the CR80, CR81 and CR82 from ADE Optical Systems Corp. of Charlotte, N.C., U.S.A. Such tools can determine the size and location of defects on the silicon wafer surface (commonly referred to as LPDs). It is well known in the art that when measuring the size of LPDs on the surface of a wafer using a laser scatter inspection tool, the actual size of the LPD is not determined; rather, the detected defect (i.e., light scattering event) scatters light equivalent to a latex sphere (LSE) of a particular diameter (e.g., a latex sphere with a diameter larger than about 0.0.95 μm which is the current detection limit for laser scatter inspection tools such as the SURFSCAN 6220 and the SURFSCAN SP1). Prior to being thermally treated, a void-rich wafer typically has a concentration of LPDs on the front surface of the wafer that is greater than about 3 LPDs/cm$^2$, about 6 LPDs/cm$^2$ or even about 8 LPDs/cm$^2$.

Typically, a thermal treatment comprises heating one or more wafers and removing layers of silicon oxide from the surfaces of the heated wafers (e.g., the native oxide layer). Preferably, the wafers are heated to a temperature of at least about 1100° C., more preferably at least about 1150° C. and still more preferably to a temperature from about 1200° C. to about 1250° C. This heating preferably is conducted while the surfaces of the silicon wafers are exposed to, or contacted with, an atmosphere consisting essentially of no oxidants such as $CO_2$ (e.g., less than about 0.001 wt % of an oxidant, preferably less than about 0.0001 wt % of an oxidant, and most preferably 0 wt % of an oxidant). Additionally, the atmosphere preferably does not substantially etch or remove silicon from the native oxide free front surface (e.g., less than about 0.1 nm/min of silicon is removed from the surface of the silicon wafer). This ambient may comprise hydrogen, a mono-atomic noble gas selected from the group consisting of helium, neon, argon, krypton, xenon, and mixtures thereof. Preferably, the hydrogen is not introduced until the temperature in the furnace is above about 950° C. As such, mono-atomic noble gases are preferred and argon is the most preferred mono-atomic noble gas because it tends to be the lowest cost and most widely available mono-atomic noble gas. High purity argon is commercially available at various grades, such as ultra high purity grade (UHP 5) which has a purity of 99.999 wt % and very large scale integration grade (VLSI 5.7+) which has a purity of 99.9995 wt %.

The thermal treatment of the present invention may be carried out in any number of commercially available thermal processing or annealing furnaces in which at least one wafer and preferably a multiplicity of wafers is/are heated while exposed to, or contacted with, one or more controlled atmospheres. An example of such a furnace is an ASM model A412 vertical furnace in which 125 silicon wafers are loaded into a silicon carbide boat made, for example, by AG Electronic Materials. The atmosphere to which the wafers are exposed is preferably flowed through the furnace/reactor at a rate of about 5 liters/min to about 100 liters/min, and more preferably about 10 liters/min to about 20 liters/min. The pressure of the atmosphere in the furnace may range from sub-atmospheric to super-atmospheric, however, atmospheric pressure is preferred due to cost and safety concerns.

The wafers are preferably heated at a rate which does not cause slip. More specifically, if a wafer is heated too quickly (e.g., at a rate greater than about 35° C. per second), a thermal gradient may develop that can create an internal stress sufficient to cause different planes within the wafer to shift relative to each other (i.e., slip). In general, until the temperature of a wafer exceeds about 750° C. the rate of changes is not overly critical, but between about 750 and about 1100° C. the temperature of the wafer is preferably not changed by more than about 40° C. per minute to avoid slip. Between about 1100 and about 1150° C., the rate of temperature change is preferably controlled to no more than about 10° C. per minute to avoid slip. Between about 1150 and about 1200° C., the rate is preferably controlled to no more than about 5° C. per minute to avoid slip. In view of the foregoing, the temperature profile of the wafer preferably resembles a parabola with an extended horizontal portion corresponding to a duration when the wafer is held at a substantially constant temperature before being cooled.

Upon reaching an annealing temperature of at least about 1100° C., more preferably a temperature of at least about 1150° C., and still more preferably a temperature from about 1200° C. to about 1250° C., silicon oxide (e.g., the native oxide layer, which is typically no greater than about 20 Å thick) is removed from the surfaces of the wafers. The atmosphere or ambient may be the same as that used to heat the wafers to the annealing temperature or it may be modified. As described above, the wafer is typically heated to the annealing temperature in an atmosphere or ambient comprising argon. Upon the reaching the annealing temperature, it may be desirable to introduce hydrogen to the atmosphere or ambient. If introduced, the concentration of hydrogen in the atmosphere or ambient is typically at least about 20% hydrogen with the remainder preferably being a mono-atomic noble gas such as argon. In general, the higher hydrogen concentrations are preferred. As such, in order of increasing preference, the atmosphere comprises at least about 30, 40, 50, 60, 70, 80, 90, or even 100 percent hydrogen. The hydrogen gas is preferably 99.99999999% pure. At temperatures of at least about 1100° C., the the oxide is removed from the wafer surface at a rate that is between about 1 to about 2 nanometers per minute. Thus, a typical native oxide layer is removed in less than about two minutes.

Although the native oxide is removed quickly, the wafers are preferably contacted with hydrogen, a mono-atomic noble gas, or combination thereof while at a temperature of at least about 1100° C. for a duration that is at least sufficient to reduce the size of COPs at or near the surface of the silicon wafer (e.g., at least about 10 minutes) and/or to reduce the concentration of LPDs on the surfaces of the wafers. The reduction of agglomerated vacancy defects is primarily due to the migration of silicon atoms from the surface and sub-surface regions surrounding agglomerated vacancy defects to the defect sites (after oxide has been removed from the walls of the sites). Preferably, the duration is between about 30 minutes and about 90 minutes. More preferably, the exposure to the cleaning gas is about 60 minutes.

After being exposed to the atmosphere comprising hydrogen, a mono-atomic noble gas, or a combination thereof for the desired duration, the flow of the hydrogen, if it had been introduced, is preferably stopped and the oxide-free front surface of the heated wafer is exposed to a vacuum (e.g., less than about 5 milliTorr) or, preferably, an atmosphere comprising one or more mono-atomic gasses (e.g., argon) as described above. Typically, the cessation of hydrogen or reintroduction of the argon atmosphere coincides with a decrease in the temperature of the wafers, and continues at least until the wafers are cooled to a temperature of about 800° C. or less. It is to be noted that the migration of silicon atoms is believed to continue at least until the wafers cool to about 1100° C. To avoid slip, the decrease in the temperature of the wafers to about 1100° C. is typically at least about 10 minutes. Preferably, the decrease in temperature to about 1100° C. takes between about 30 minutes and about 90 minutes. More preferably, the duration is about 60 minutes.

Referring to FIG. 1, subjecting the silicon wafer to the thermal treatment of the present invention results in the formation of a stratum 21 extending from the front surface 3 inward a distance (e.g., typically at least about 5 µm), Ds, the stratum having a density of agglomerated vacancy defects which is reduced, as compared to the density of such defects throughout the starting material. Between the stratum 21 and the imaginary central plane 7, it is presently believed that the density of agglomerated vacancy defects 20 is unchanged. Specifically, the volume of the wafer between the stratum 21 and the imaginary central plane 7 (i.e., the bulk of the wafer) has a density of agglomerated vacancy defects that is between about $1 \times 10^3$ defects/cm$^3$ and about $1 \times 10^7$ defects/cm$^3$ and typically between about $1 \times 10^5$ defects/cm$^3$ and $1 \times 10^6$ defects/cm$^3$, whereas, the stratum 21 has a density of agglomerated vacancy defects that is preferably less than about 50% of the density of agglomerated vacancy defects in the bulk of the wafer. More preferably the density of agglomerated vacancy defects in the stratum 21 is less than about 30%, 20% or 10% of the density of agglomerated vacancy defects in the wafer bulk. Most preferably, the stratum 21 is substantially free of agglomerated vacancy defects, i.e., the density of agglomerated vacancy defects is less than the detection limit of these defects, which is currently about 10 defects/cm$^3$.

The decrease in size and/or concentration of agglomerated vacancy defects is likewise realized in a decrease in the average concentration of LPDs on the wafer surface. Preferably, the decrease is by at least about 50%, 70%, 80%, 90%, or greater. Thus, an average concentration of LPDs (greater than about 0.095–0.120 µm LSE.) that is less than about 1 LPDs/cm$^2$ is readily attainable. Preferably, the average concentration of LPDs that is less than about 0.5 LPDs/cm$^2$, more preferably less than about 0.1 LPDs/cm$^2$, still more preferably less than about 0.05 LPDs/cm$^2$, and even more preferably less than about 0.005 LPDs/cm$^2$. Still more preferably, the size and/or concentration of the agglomerated vacancy defects is reduced to such an extent that the defects cannot be detected by current laser scatter inspection tools.

The foregoing decrease in agglomerated vacancy defects on the surfaces of the silicon wafers is not accompanied by an unacceptable increase in the haze on the surfaces of the heat treated silicon wafers. "Haze" is defined as the ratio of scattered light (photons) to incident light, and is considered to depend at least in part on the micro-roughness of the surface. See, e.g., S. Varharerbeke, T. Futatsuki, R. Messousi and T. Ohmi, The Effects of $H_2$ Annealing on the Si Surface and Its Use in the Study of Roughening During Wet Chemical Cleaning, *Electrochem. Soc. Proceedings*, Vol. 93-8, p. 1170, 1993. An unacceptable increase in haze is defined as increase in haze greater than about 500% compared to the haze on the surface of the silicon wafer prior to being thermally treated. Thus, an acceptable increase in haze is less than about 500% compared to the haze on the surface of the silicon wafer prior to being thermally treated. Preferably, the increase in haze is less than about 350%, more preferably less than about 300%, and still more preferably less than about 200%.

The degree of haze is determined using a laser scatter inspection tool that collects scattering data and filters it using a haze processor to separate the haze information from the LPD information. Each inspection tool has its own unique optical design, and as a result, inspecting a wafer with different inspection tools yields different haze values. To scan the entire front surface of the wafer, the SURFSCAN 6220 tool directs the laser beam across the wafer surface as the wafer moves in a direction perpendicular to the direction the beam travels. As such, the orientation of the wafer with respect to the scanning laser beam can influence haze values (all the haze levels disclosed herein were determined with the notch of the wafer oriented at the 6 o'clock position in the loading cassette). In contrast, the newer SURFSCAN SP1 inspection tool has symmetric collection optics and uses a spiral scanning pattern which results in the haze measurement being unaffected by wafer orientation. A surface haze higher than about 1.2 ppm as measured by a SURFSCAN 6220 laser scatter inspection tool limits the ability to detect LPDs less than about 0.2 µm LSE and is typically considered undesirable. Similarly, a surface haze higher than about 0.2 ppm as measured by a SURFSCAN SP1 laser inspection tool is considered undesirable. For comparison, the haze on the surface of an epitaxial silicon wafer measured by a SURFSCAN 6220 is typically about 0.8 ppm to about 1.1 ppm.

The front surface of a silicon wafer treated in accordance with the method of the present invention has a degree of haze that is less than about 1.2 ppm, preferably less than about 0.7 ppm and more preferably between about 0.5 ppm to about 0.3 ppm as measured by a SURFSCAN 6220 laser scatter inspection tool. As measured by a SURFSCAN SP1 laser scatter inspection tool, the front surface of a silicon wafer treated in accordance with the method of the present invention has a degree of haze that is less than about 0.17 ppm, preferably less than about 0.15 ppm and more preferably between about 0.13 ppm and about 0.10 ppm.

Figure 2:
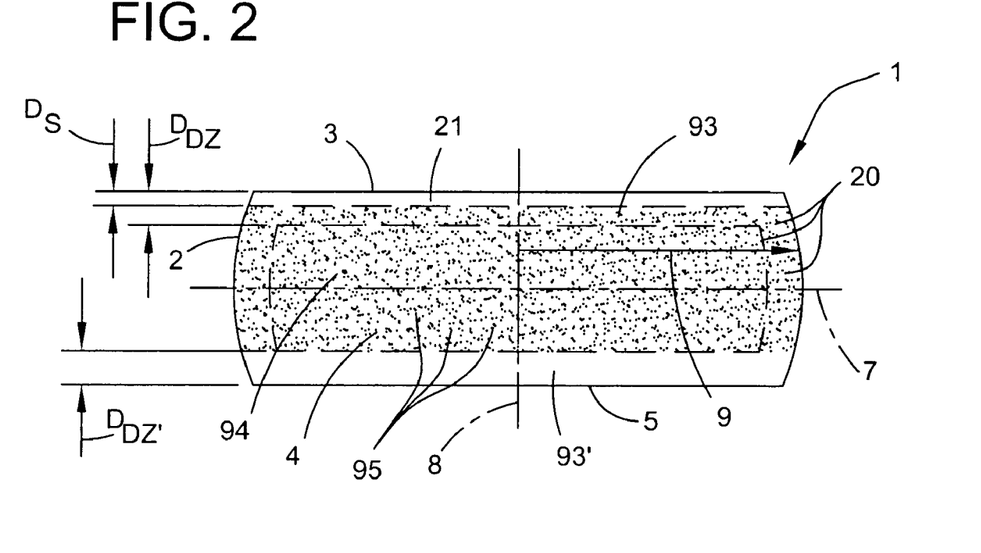
FIG. 2 shows an oxygen precipitate profile of a wafer which may be prepared in accordance with the present invention.

In addition to reducing the concentration of COPs on the surface of the wafers, the annealing process also installs a what is commonly referred to as a denuded zone. A denuded zone is a region extending inward from the surface of a wafer that is substantially free of oxidation precipitates (e.g., a typical denuded zone comprises less than about $1 \times 10^6$ oxygen precipitates or bulk micro defects per cm$^3$). In contrast the region of the wafer inward from the denuded zone typically comprises oxygen precipitates or bulk micro defects at a concentration that is between about $1 \times 10^7$ to about $5 \times 10^{10}$ precipitates/cm$^3$. Referring to FIG. 2, a wafer having an oxygen precipitate distribution which may be formed by heat-treating a wafer prepared in accordance with this invention is depicted. In this particular embodiment, the wafer substrate 4 is characterized by regions 93 and 93' ("denuded zones") which are free of oxygen precipitates 95. These zones extend from the front surface 3 and back surface 5 to a depth of $D_{dz}$ and $D_{dz}'$, respectively. Preferably, $D_{dz}$ and $D_{dz}'$ are each from about 10 µm to about 50 µm, and more preferably from about 20 µm to about 30 µm. Between the oxygen precipitate-free regions 93 and 93', there is a region 94 which contains a substantially uniform concentration of oxygen precipitates. It should be recognized that the purpose of FIG. 2 is to help acquaint those skilled in the art with this invention by illustrating merely one embodiment of this invention. This invention is not limited to that embodiment.

Removal of Copper from Wafers

The fact that the disclosure is primarily directed to an embodiment in which the process of the present invention is incorporated into a thermal process such as a hydrogen-argon anneal is not to be interpreted as limiting the scope of applicability of the present invention. The process of the present invention may be performed in conjunction with other relatively high temperature silicon wafer processes that involve oxidation of the wafer surface.

The process of the present invention is performed on one or more polished wafers that are preferably free of oxygen or oxide on their surfaces. When incorporating the removal of metallic contaminants with a hydrogen-argon anneal, the process typically comprises forming an oxide layer on a bare silicon wafer surface because the native oxide layer (typically less than about 20 Å thick) has been removed so that the COPs on or near the wafer's surface may be reduced in size or eliminated.

For purposes of reducing metallic contamination, the thickness of the oxide layer is not overly critical, provided that it is sufficiently thick enough to result in the formation of a strain layer in the silicon at or near the wafer surface that is sufficient to retain enough copper so that the bulk copper is reduced to the desired level after the wafer is cleaned. Additionally, it is preferred that the thickness of the oxide layer not be so great so as to prevent the removal of the diffused copper during the cleaning operation. Results to date indicate that satisfactory retention of diffused copper and complete removal of the diffused copper using a standard SC1 and SC2 cleaning operation may be achieved forming an oxide layer that is between about 5 and about 20 Å thick. Preferably, the oxide layer thickness is less than about 15 Å. Still more preferably, the oxide layer thickness is between about 7 and about 15 Å. Although the oxide layer could exceed about 20 Å (i.e., it may be a relatively thick oxide layer), but this is generally not preferred because removing the diffuse copper will typically require a longer cleaning operation, a greater amount of cleaning solution(s), and/or more aggressive cleaning solutions, any one of which may increase the cost of the wafers and/or damage the wafer surfaces.

A thermal treatment such as a hydrogen-argon anneal is typically performed simultaneously on a multiplicity of wafers. Specifically, a hydrogen-argon anneal is typically performed in an annealing furnace sized and configured to process a multiplicity of wafers in a single batch. One such furnace is the aforementioned ASM model a412 vertical furnace. To achieve an effective removal of metallic contaminants from the group of wafers, the uniformity of the oxide layer thickness among the wafers is not overly important. That is to say, an effective removal of copper may be achieved for all the processed wafers even if some wafers have oxide layers as relatively thin as, for example, 5 Å and other wafers have oxide layers as relatively thick as, for example, 20 Å. But the uniformity of the oxide layers does tend to be a factor for other wafer qualities. For example, if the thickness of the oxide layer is not uniform from wafer to wafer (e.g., the variation of oxide thicknesses for a group of wafers is such that the difference between the thinnest and thickest oxide layers is greater than about 5 Å), the subsequent cleaning process may produce surface defects (e.g., pits) on some of the wafers, especially those with relatively thin oxide layers. Specifically, it is believed that a relatively thin oxide layer causes the cleaning process to excessively remove silicon from the wafer and form pits. Those defects may be detected using laser scatter inspection tools such as the aforementioned Tencor 6220 or Tencor SP-1 and are referred to as LPDs.

In view of the foregoing, when performing the process of the present invention simultaneously on a multiplicity of wafers it is preferred that the variation in thickness among the oxide layers (formed before performing the process or during the process) be kept to a minimum. Specifically, it is preferred that for a group of simultaneously processed wafers the difference between the thinnest and the thickest oxide layers be less than about 5 Å. More preferably, the difference between the thinnest and the thickest oxide layers is less than about 3 Å. Stated another way, for a group of wafers having an average oxide thickness that is within any one of the foregoing preferred ranges, the standard deviation (sigma) from the average oxide thickness for the group is, in order of increasing preference, less than about 2.0 Å, 1.0 Å, 0.5 Å, 0.3 Å, 0.2 Å, 0.1 Å, or smaller.

As mentioned above, when performing the process of the present invention as part of an existing thermal process such as a hydrogen-argon anneal, the oxide layers on the wafers are typically formed as part of the process because any oxide on the surface was typically removed (i.e., the surfaces of the wafers are essentially bare silicon). In such a situation, the process of the present invention preferably comprises forming oxide layers on the silicon wafers via a gas-phase oxidation. In general, the gas-phase oxidation comprises contacting one or more silicon wafers with an atmosphere, ambient, or gas that comprises oxygen. Although any appropriate oxidizing atmosphere, ambient, or gas known to those of skill in the art may be used (e.g., oxygen, ozone, water vapor, or a combination thereof), oxygen is generally preferred because it is widely available at a purity sufficient for semiconductor manufacturing at a relatively low cost. When using oxygen, it is generally preferred that the oxygen be pure (e.g., 99.99999999% pure). To achieve such a degree of purity, the oxygen is typically treated with drying equipment such as that available from SAES PURE GAS and NUPURE. Thus, in one embodiment of the present invention the surfaces of the silicon wafers are exposed to, or contacted with, an atmosphere comprising oxygen for a duration sufficient to form oxide layers on the wafers in accordance with the above-described thickness and variation ranges.

The gas-phase oxidation is typically performed, at least in part, while the wafers are at elevated temperatures (e.g., at a temperature or temperatures greater than about 500° C.). More specifically, when performing the process of the present invention as part of a hydrogen-argon anneal, the wafers are preferably oxidized as they are cooled from the maximum anneal temperature (e.g., a temperature from about 1200° C. to about 1250° C.). Although the wafers may be oxidized at nearly any temperature or through a range of temperatures, they are preferably oxidized at temperatures below about 1200° C. More preferably, the wafers are oxidized at temperatures below about 1100° C., 1000° C., or even 900° C. Still more preferably, the oxidation of the wafers does not begin until the wafers are cooled to a temperature that is no greater than about 800° C. Even more preferably, the oxidation of the wafers does not being until the wafer are cooled to a temperature that is no greater than about 775° C. Or stated another way, the oxidation initiation temperature is preferably no greater than 800° C., and more preferably no greater than about 775° C. By performing the oxidation at temperatures no greater than about 800° C., the oxide layers tend to grow uniformly to a thickness in accordance with foregoing desired ranges. Specifically, it has been observed that at temperatures greater than about 800° C., the oxidation reaction tends to be controlled by the diffusivity of the oxygen in the atmosphere, which results in relatively non-uniform oxide layer thicknesses among the wafers. More specifically, the wafers near gas inlets tend to have significantly thicker oxide layers than wafers located further away from the inlets. In contrast, at temperatures below about 800° C. the oxidation reaction tends to be kinetically controlled (i.e., the oxidation reaction tends to be controlled by the reaction between silicon and oxygen rather than the ability of oxygen to diffuse to a wafer surface). Thus, the oxide forms on the multiplicity of wafers at substantially similar rates regardless of position in the chamber, and therefore, the thicknesses of the oxide layers tend to be substantially uniform.

Although the beginning the oxidation at a temperature below about 800° C. is generally preferred, it is also preferred at least for ease of incorporation into existing thermal processes, minimizing process times, and reducing cost, that the gas-phase oxidation is initiated at a temperature greater than about 500° C. More preferably, the oxidation is initiated at a temperature of at least about 600° C. Still more preferably, the oxidation is initiated at a temperature of at least about 700° C. Even more preferably, the oxidation is initiated at a temperature of at least about 750° C.

In addition to the oxidation temperatures, it was discovered that the concentration of oxygen in the atmosphere tends to affect the uniformity of the oxide layers. Specifically, it was discovered the concentration of oxygen in the atmosphere is preferably increased as the oxidation temperatures increase. Without being held to a particular theory, it is believed the foregoing relationship is due to the fact that at relatively high temperatures (e.g., greater than about 1100° C.) the oxide formed on the wafers tends to evaporate from the surface, which can result in non-uniform oxide layers that lead to pitting of a wafer surface during cleaning. This tendency to evaporate is particularly acute at relatively low oxygen concentrations (e.g., below about 64 ppm). Thus, if the wafers are oxidized at temperatures greater than about 800° C., the concentration of oxygen in the atmosphere is preferably increased to reduce the propensity for pit formation. Although increase oxygen concentration tends to improve the oxide layer uniformity, it also tends to increase oxide layer thickness.

Although the concentration of oxygen in the oxidizing ambient, at least for purposes of reducing the concentration of copper, is not overly critical, the foregoing observations indicate that lower concentrations of oxygen at lower oxidation temperatures tend to be desirable for limiting the formation of surface defects on the wafers. For example, although exposing wafers to an oxidizing ambient comprising about 15000 ppm of oxygen was effective at removing copper, it results in the wafers having an excessive amount of light point defects from pitting (see Test Group 4 wafers in Table A, below). Thus, it is generally preferred that the oxygen concentration in the oxidizing ambient be less than about 10,000 ppm (i.e., about 1 percent) to ensure that the treated wafers do not have an excessive amount of light point defects. In order of increasing preference, it is more preferred that the concentration of oxygen be no more than about 5000, 1000, 500, 100, or even lower. For example, exposing the wafers to an oxidizing ambient comprising about 64 ppm resulted in excellent copper removal and low degree of surface defect formation (see Test Group 7 wafers in Table A). At the lower end, it is generally preferred that the concentration of oxygen in the oxidizing ambient be at least about 1 ppm. More preferably, the concentration of oxygen is at least about 10 ppm. Still more preferably, the concentration of oxygen is at least about 25 ppm.

In addition to the oxidation temperature(s) and oxygen concentration, the duration of the oxidation tends to play a role in the uniformity of the oxide layers, especially at relatively low oxygen concentrations. Specifically, the length of time the wafers are contacted with the oxidizing ambient is preferably controlled so that the oxide layers have uniform thicknesses. More specifically, it has been observed that as the concentration of oxygen decreases the length of time needed to uniformly oxidize the wafers tends to increase. For example, at a relatively high oxygen concentration of about 15,000 ppm, wafers tend to be uniformly oxidized in a short period of time such as 4 minutes (see Test Wafer Groups 3 and 4 of Table A). At substantially lower oxygen concentrations (e.g., about 64 ppm), however, an oxidation duration of about four minutes or even eight minutes will tend to nonuniformly oxidize the wafers (see Test Wafer Groups 5 and 6 of Table A). But by prolonging the exposure or contact with a low-concentration oxidizing ambient, the copper may be removed without negatively impacting the surface quality of the wafers (see, e.g., Test Wafer Group 7 of Table A). To summarize, although the length of time the wafers are exposed or contacted with the oxidizing ambient may vary widely (e.g., it may be as short as about one minute or as long as about one hour), it is generally preferred that the duration (along with the temperature and oxygen concentration) is preferably controlled to yield uniform oxide layers that are thick enough for effective copper gettering without being so thick as to require a longer and/or more aggressive cleaning operation than is typical for polished wafers. Typically, these conditions are met when the length of time the wafer is exposed to an oxidizing ambient in the chamber is at least about 10 minutes. Preferably, the duration is at least about 20 minutes. More preferably, the duration is at least about 30 minutes. Still more preferably, the duration is at least about 40 minutes.

It is to be noted that the such durations are typically achieved without modification to the duration or the rate at which the wafers are cooled for a typical hydrogen-argon anneal. In fact, it has been determined that the wafers are preferably exposed to, or contacted with, the oxidizing ambient upon reaching a temperature within the range of about 750° C. to about 700° C. until they are removed from the thermal treatment furnace, which is typically after the wafers have cooled to a temperature that is below about 600° C., 550° C., 500° C., 450° C., 400° C., or even lower. It has been determined that removing the wafers from the furnace upon reaching a temperature of about 450° C. tends to maximize throughput and thereby reduce manufacturing costs. Because a furnace is typically controlled so that below about 1000-900° C. the wafers are cooled at a rate that is less than about 30° C. per minute (preferably, the rate is between about 10 and 20° C. per minute), the temperature of the wafers is preferably between about 750° C. and about 450° C. for a duration of at least about 10 minutes (preferably between about 15 minutes and about 30 minutes).

As indicated above, the process of the present invention involves diffusing metal contaminants in general, and copper in particular, from the bulk of a wafer to the strain region at or near the surface of the wafer. Specifically, the gettering process is thermally driven by heating the wafer to at least about 500° C. (e.g., to between 1100° C. and about 1200° C.), which typically dissociates copper-boron complexes, followed by cooling the wafers to below about 500° C. (e.g., between about 400° C. and about 300° C.) in a manner so that the released copper diffuses to the oxide-induced strain region where it can be removed from the wafer using standard, state-of-the-art cleaning methods and chemistries. The diffusion of copper is due primarily to the fact that as the wafer is cooled below about 500° C. the solubility of copper in silicon decrease dramatically while the diffusivity (diffusion length) of the copper in the silicon remains relatively high (e.g., $7.4 \times 10^{-6}$ cm$^2$/sec).

The process of the present invention is preferably carried out so that the wafers reside within the range of temperatures appropriate for diffusion of the release copper for a duration sufficient to reduce the bulk concentration of copper to less than about $1 \times 10^{10}$ atoms/cm$^2$, less than about $5 \times 10^9$ atoms/cm$^2$, or less than about $1 \times 10^9$ atoms/cm$^2$. In general, for a given copper concentration, the necessary duration tends to be shorter at greater temperatures; likewise, a longer duration is associated with lower temperatures. For example, if a wafer were held at about 500° C. the duration necessary for copper diffusion may be as little as about 30 seconds. In contrast, if the wafers were rapidly cooled or quenched from a temperature at which the copper concentration was below the solubility limit to about 100° C., the duration at about 100° C. may be as long as about three hours. At temperatures at which copper is especially mobile and the solubility limit is significantly below the concentration of copper in the wafer (e.g., below about 300–400° C. and above about 100° C.), a sufficient duration may be in the range of tens of minutes (e.g., from about 10 minutes to about 60 minutes). Advantageously, the duration and temperatures associated with cooling wafers as part of a thermal process such as a hydrogen-argon anneal are typically sufficient to achieve the desired reduction in bulk copper. For example, acceptable levels of copper diffusion have been observed by cooling the wafers at a rate that is between about 10 and 20° C. per minute from about 750° C. to about 450° C. (typically between about 15 and about 30 minutes), removing the wafers from the furnace upon reaching 450° C. (typically about 20 minutes), followed by cooling to room temperature outside the furnace (typically about 20 minutes). It is to be noted that the exposure to the oxidizing ambient and the diffusion of copper to the strain region may at least partially overlap or may occur sequentially.

After the thermal processing or annealing is complete, the wafer(s) is/are subjected to a cleaning step which effectively removes copper from the wafer(s). Typical cleaning solutions include piranha mixtures (mixtures of sulfuric acid and hydrogen peroxide), RCA-type SC1 and SC2 cleaning solutions (see, e.g., F. Shimura, *Semiconductor Silicon Crystal Technology*, Academic Press, 1989, pp. 188–191 and Appendix XII, incorporated herein by reference). The wafers may be immersed in the cleaning solution, or alternatively, exposed to scrubbing jets.

An RCA-type SC1 solution removes organic contaminants and particles by both the solvating action of ammonium hydroxide and the powerful oxidizing action of hydrogen peroxide. Typical SC1 cleaning solutions contain between about 1000:1:1 to about 1:1:1 parts by volume $H_2O:H_2O_2:NH_4OH$ (supplied as 30–35 weight percent $H_2O_2$ in water and 28–30 weight percent $NH_4OH$ in water). That is, the SC1 cleaning solution contains $H_2O$, $H_2O_2$ and $NH_4OH$ and the ratio of $H_2O$ to $H_2O_2$ (supplied as 30–35 weight percent $H_2O_2$ in water) is between about 1000:1 and about 1:1, the ratio of $H_2O$ to $NH_4OH$ (supplied as 28–30 weight percent $NH_4OH$ in water) is between about 1000:1 and 1:1, and the ratio of $H_2O$ to $H_2O_2$ is independent of the ratio of $H_2O$ to $NH_4OH$. Preferred SC1 cleaning solutions comprise about 100:1:1 to about 5:1:1 parts by volume $H_2O:H_2O_2:NH_4OH$. Preferably, the SC1 cleaning solution is heated to a temperature between about 30 and about 80° C., and more preferably to between about 60 and about 80° C.

The wafers may be cleaned in an SC1 solution for a duration between about 5 and about 30 minutes. If the wafers are immersed in the cleaning solution for a longer time, excessive etching, pitting and roughening can occur. After cleaning, the wafers are immersed in a rinse bath to quench the reaction and remove the SC1 cleaner from the wafer surfaces. The wafers are rinsed for a period of about 2 to about 60 minutes, typically from about 5 to about 45 minutes, in deionized water having a resistivity of about 3 to about 18 mega-Ohms, preferably greater than about 17 mega-Ohms.

A typical SC2 bath may contain about 1:1:5 to about 1:1:1000 parts by volume of $HCl:H_2O_2:H_2O$. The temperature the SC2 solution is preferably between about 10 and about 90° C., and the silicon wafers are immersed in a flowing bath of this solution for a period of at least about 0.1 minutes. These solutions effectively remove alkali and transition metals, and prevent redeposition from the solution by forming soluble metal complexes.

A HF solution may also be used to clean the silicon wafers. A typical HF solution contains about 1:1 to about 1:10,000 parts by volume $HF:H_2O$ (supplied as 49 weight percent HF in water). To enhance metals removal, the solution may additionally contain HCl (1000:1 to 1:1000 parts by volume HF:HCl), hydrogen peroxide (1:1 to 1:1000 parts by volume HF to $H_2O_2$), isopropyl alcohol (10,000:1 to 1:10 parts by volume HF:IPA) or ozone (about 0.05 to about 50 ppm).

After being cleaned, the wafers have a surface copper concentration that is preferably less than about $1 \times 10^{10}$ atoms/cm$^2$, more preferably less than about $5 \times 10^9$ atoms/cm$^2$, and still more preferably less than about $1 \times 10^9$ atoms/cm$^2$. Further, the cleaned wafers have a bulk concentration of copper that is preferably less than about $1 \times 10^{10}$ atoms/cm$^2$, more preferably less about $5 \times 10^9$ atoms/cm$^2$, and still more preferably less than about $1 \times 10^9$ atoms/cm$^2$.

EXAMPLES

The annealing furnace used was an ASM model A412 vertical furnace equipped with a high purity TSQ-10 quartz tube manufactured by Toshiba Ceramics and a 125 slot silicon carbide boat design to hold 200 mm wafers. The silicon carbide boat had a high purity silicon carbide coating deposited thereon by chemical vapor deposition by AG Electronic Materials. After performing the annealing process, the wafers were cleaned with a SubMicron Systems wet bench and standard SC1 and SC2 cleaning solutions as described in greater detail above.

Each test group of wafers was subjected to a standard hydrogen anneal. Specifically, the wafers (with native oxide layers) were placed in the furnace and heated to a temperature of about 1200° C., held at 1200° C. for about one hour, and then cooled. A plot of the temperature as a function of anneal time from between about 450° C. to the maximum temperature and back to about 450° C. generally resembles a parabola except that there is an extended horizontal portion corresponding to the duration of the 1200° C. hold. As the wafers were heated to about 1200° C. and cooled from about 1200° C. they were exposed to an atmosphere comprising argon. But the wafers as the wafers were held at about 1200° C. for about an hour they were exposed to an atmosphere comprising about 100 percent hydrogen. The gas flow rates of argon and hydrogen through the furnace were about 20 liters per minute and 12 liters per minute, respectively.

In addition to argon, the wafers of Test Groups 3–7 were exposed to oxygen while being cooled. The concentration of the oxygen in the furnace was varied for these wafers. The flow of oxygen was initiated when the wafers were cooled to about 700° C. (i.e., the oxygen initiation temperature was about 700° C.) and was maintained for a duration set forth in Table A below. It is to be noted that the flow of argon was maintained throughout the cool down (i.e., the flow of oxygen was in addition to the flow of argon). The flow rate of oxygen for Test Groups 3 and 4 was about 300 milliliters per minute which corresponded to an atmospheric oxygen concentration of about 15,000 parts per million. The flow rate of oxygen for Test Groups 5–7 was about 2 milliliters per minute, which corresponded to an atmospheric oxygen concentration of 64 parts per million. The duration of the oxygen flow for Test Group 7 corresponded to the time needed to cool the wafers from about 700° C. to their removal of the furnace at about 450° C. For Test Groups 3–6, after the flow of oxygen was ended the flow of argon continued until the wafers were removed from the furnace upon reaching about 450° C. It should be noted that from about 700° C. to about 450° C. the cooling rate was approximately 15° C. per minute and substantially constant (i.e., the decrease in temperature as a function of time was nearly linear).

The thickness of the oxide layers on the wafers was measured using elipsometry. Some of the wafers (indicated in Table A) were cleaned in accordance with the above description regarding SC1, SC2 cleaning. After measuring the oxide layers thickness and, if performed, after cleaning the wafers, the surface concentration or bulk concentration of copper for the wafers was determined according to the above-described method. After measuring the copper concentration, the wafers were analyzed for the presence of light point defects. The results of the foregoing tests are set forth in Table A below.

Although the copper was effectively reduced in the Group 3 and 4 wafers, the relatively high light point defect counts indicate that the process negatively impacted the surfaces of the wafers. Without being bound to a particular theory, it is believed that light point defect counts were high because the oxide layers were relatively thick and were formed relatively fast. The test results of the Groups 5 and 6 wafers also indicate that although the process effectively reduced bulk copper, it negatively impacted the quality of the surface. For these wafers, it is believed that the relatively high concentrations of light point defects were due to pitting caused by non-uniform oxidation of the wafers. The test results of the Group 7 wafers, however, indicate that in addition to reducing copper, the process of the present invention may be performed in a manner which may be incorporated into an existing thermal process such as a hydrogen-argon anneal to effectively reduce or eliminate agglomerated vacancy defects such as COPs.

It is to be understood that the above description is intended to be illustrative and not restrictive. Many embodiments will be apparent to those of skill in the art upon reading the above description. The scope of the invention should therefore be determined not with reference to the above description alone, but should be determined with reference to the claims and the full scope of equivalents to which such claims are entitled.

When introducing elements of the present invention or an embodiment thereof, the articles "a", "an", "the" and "said" are intended to mean that there are one or more of the

TABLE A

| Test Group of Wafers | Oxidation Time (min) | Oxygen Conc. (ppm) | Final Clean | Bulk Copper Conc. (E10 at/cm$^2$) | Avg. No. of LPDs >0.12 μm per wafer | Avg. Oxide Thickness [sigma] before cleaning (Å) | Surface Copper Conc. (E10 at/cm$^2$) |
|---|---|---|---|---|---|---|---|
| Control 1 | 0 | 0 | no | n/a | 4.9 | 0 | 2.81 |
| Control 2 | 0 | 0 | yes | n/a | 5.6 | 0 | 0.15 |
| 1 | 0 | 0 | no | 22.4 | 4.2 | 0 | |
| 2 | 0 | 0 | yes | 16.1 | 4.9 | 0 | |
| 3 | 4 | 15,000 | no | 15.6 | 61.7 | 14.1 [0.4] | |
| 4 | 4 | 15,000 | yes | 0.76 | 22.8 | 14.1 [0.4] | |
| 5 | 4 | 64 | yes | 3.5 | 15.3 | 6.5 [1.8] | |
| 6 | 8 | 64 | yes | 1.6 | 164 | 8.3 [1.1] | |
| 7 | 44 | 64 | yes | 2.8 | 4.8 | 8.6 [0.1] | |

The results set forth in Table A have been interpreted to reach several conclusions. For example, the wafers from Control 1 and Control 2 indicate that the cleaning reduces the amount of copper on the surface of an annealed wafer. These surface copper concentrations represent the amount of copper that would be on a wafer without performing the bulk copper determination. The results for the Test Group 1 and 2 wafers indicate that without in-situ oxide growth the wafers had acceptable levels of light point defects, but a relatively high bulk copper concentration. The results for the Test Group 3 wafers indicate that the process produced a significant amount of copper diffusion to the strain region. The test results of the Group 4 wafers, which were treated identically to the Group 3 wafers except for the addition of a cleaning step before determining the bulk copper concentration, indicate that the combination of the anneal and the clean resulted in a significant removal of copper and produced wafers with an acceptable level of bulk copper.

elements. The terms "comprising", "including" and "having" are intended to be inclusive and mean that there may be additional elements other than the listed elements.

The recitation of numerical ranges by endpoints includes all numbers subsumed within that range. For example, a range described as being between 1 and 5 includes 1, 1.6, 2, 2.8, 3, 3.2, 4, 4.75, and 5.

What is claimed is:

1. A process for removing a contaminant selected from among copper, nickel, and a combination thereof from a silicon wafer having a silicon wafer surface and a silicon wafer interior, the process comprising:
   a) cooling the silicon wafer in a controlled atmosphere from a temperature above an oxidation initiation temperature;
   b) initiating a flow of an oxygen-containing atmosphere at said oxidation initiation temperature to create an oxidizing ambient around the silicon wafer surface to form an oxide layer on the silicon wafer surface and a strain layer at an interface between the oxide layer and the silicon wafer interior;

c) controlling the cooling of the silicon wafer from said oxidation initiation temperature to permit diffusion of atoms of the contaminant from the silicon wafer interior to the strain layer; and d) cleaning the silicon wafer to remove the oxide layer and the strain layer, thereby removing said contaminant having diffused to the strain layer.

2. The process of claim 1 wherein the oxidation initiation temperature is at least about 600° C.

3. The process of claim 1 wherein the oxidation initiation temperature is less than about 800° C.

4. The process of claim 1 wherein the oxidation initiation temperature is between about 800 and about 600° C.

5. The process of claim 1 wherein the oxidation initiation temperature is about 775° C.

6. The process of claim 1 wherein the controlling the cooling comprises maintaining a cooling rate that is less than about 30° C. per minute during cooling from the oxidation initiation temperature to a temperature between about 500° C. and about 400° C.

7. The process of claim 1 wherein the oxide layer has a thickness of at least about 5 Å.

8. The process of claim 1 wherein oxygen-containing atmosphere is flowed around the silicon wafer surface for at least about 10 minutes.

9. The process of claim 1 wherein the oxygen-containing atmosphere comprises a concentration of oxygen that is between about 1 and about 10000 parts per million.

10. The process of claim 1 wherein after cleaning the silicon wafer to remove the oxide layer and the strain layer the silicon wafer has a bulk copper concentration that is less than about $1 \times 10^{10}$ atoms/cm$^2$.

11. The process of claim 1 wherein the said cooling is from a temperature of at least about 1100° C.

12. The process of claim 4 wherein the said cooling is from a temperature of at least about 1100° C.

13. A process for removing a contaminant selected from among copper and nickel from a silicon wafer having a silicon wafer surface and a silicon wafer interior, the process comprising:

a) heating the silicon wafer to a temperature of at least about 1100° C. and exposing the silicon wafer surface to a cleaning ambient selected from the group consisting of hydrogen, helium, neon, argon, krypton, xenon, and mixtures thereof to remove silicon oxide from the silicon wafer surface to thereby yield a deoxidized silicon wafer;

b) cooling the silicon wafer in the cleaning ambient from the temperature of at least about 1100° C. to an oxidation initiation temperature;

c) exposing the deoxidized silicon wafer at said oxidation initiation temperature to an oxidizing ambient to form an oxide layer on the silicon wafer surface to thereby yield an oxidized silicon wafer having a strain layer at an interface between the oxide layer and the silicon wafer interior;

d) controlling the temperature of the oxidized silicon wafer to diffuse contaminant from the silicon wafer interior to the strain layer; and e) cleaning the silicon wafer to remove the contaminant that diffused to the strain layer from the silicon wafer thereby yielding a cleaned silicon wafer.

14. The process of claim 13 wherein the oxidizing ambient comprises a concentration of oxygen that is between about 10 and about 100 parts per million.

15. The process of claim 13 wherein the oxide layer has a thickness that is between about 5 and about 20° C.

16. The process of claim 13 wherein the deoxidized silicon wafer is exposed to the oxidizing ambient upon being cooled to an oxidation initiation temperature that is no greater than about 800° C.

17. The process of claim 16 wherein the deoxidized silicon wafer is being cooled at rate that is less than about 30° C. per minute.

18. The process of claim 13 wherein the deoxidized silicon wafer is exposed to the oxidizing ambient upon being cooled to an oxidation initiation temperature that is no greater than about 775° C.

19. The process of claim 18 wherein the deoxidized silicon wafer is being cooled at a rate that is between about 10 and about 20° C. per minute.

20. The process of claim 13 wherein the silicon wafer is exposed to the oxidizing ambient for a duration that is between about 30 minutes and about 60 minutes.

21. The process of claim 13 wherein the step of controlling the temperature of the oxidized silicon wafer to diffuse contaminant from the silicon wafer interior to the strain layer comprises maintaining the temperature of the silicon wafer below about 500° C. for a duration sufficient so that the cleaned silicon wafer has a bulk copper concentration that is less than about $5 \times 10^9$ atoms/cm$^2$.

22. The process of claim 13 wherein the step of controlling the temperature of the oxidized silicon wafer to diffuse contaminant from the silicon wafer interior to the strain layer comprises maintaining the temperature of the silicon wafer below about 500° C. for a duration sufficient so that the cleaned silicon wafer has a bulk copper concentration that is less than about $1 \times 10^9$ atoms/cm$^2$.

23. The process of claim 13 further comprising annealing the deoxidized silicon wafer before exposing the deoxidized silicon wafer to the oxidizing ambient to yield an annealed silicon wafer, wherein the silicon wafer is annealed by exposing the deoxidized surface of the silicon wafer to a vacuum or an annealing ambient selected from the group consisting of hydrogen, helium, neon, argon, krypton, xenon, and combinations thereof to facilitate the migration of silicon atoms to exposed agglomerated vacancy defects at the surface thereby reducing the size of the exposed agglomerated vacancy defects.

24. The process of claim 23 wherein the annealing ambient consists essentially of hydrogen and the surface of the silicon wafer is exposed to the annealing ambient for a duration that is at least about 10 minutes while the temperature of the silicon wafer is at least about 1100° C.

25. The process of claim 23 wherein the annealed silicon wafer is exposed to an ambient consisting essentially of argon until the deoxidized silicon wafer is exposed to the oxidizing ambient.

26. A process for removing a contaminant selected from among copper, nickel, and a combination thereof from a multiplicity of silicon wafers having silicon wafer surfaces and silicon wafer interiors, the process comprising:

cooling the silicon wafers in an atmosphere consisting essentially of no oxidants from a temperature above an oxidation initiation temperature to said oxidation initiation temperature, wherein the oxidation initiation temperature is less than about 800° C;

initiating a flow of an oxygen-containing atmosphere at said oxidation initiation temperature to create an oxidizing ambient around the silicon wafers surfaces to form oxide layers that are between about 5 and about 20 Å thick on the silicon wafer surfaces and strain layers at interfaces between the oxide layers and the silicon wafer interiors;

controlling the cooling of the silicon wafers from said oxidation initiation temperature to permit diffusion of atoms of the contaminant from the silicon wafer interiors to the strain layers;

cleaning the silicon wafers to remove the oxide layers and the strain layers, thereby removing said contaminant having diffused to the strain layers.

27. The process of claim 26 wherein the standard deviation of the oxide layer thicknesses is no more than about 2 Å.

28. The process of claim 26 wherein the standard deviation of the oxide layer thicknesses is no more than about 1 Å.

29. The process of claim 26 wherein the standard deviation of the oxide layer thicknesses is no more than about 0.1Å.

30. The process of claim 26 wherein the oxidation initiation temperature is no greater than about 775° C.

31. The process of claim 26 wherein the oxidation initiation temperature is at least about 750° C.

32. The process of claim 26 wherein the concentration of oxygen in the oxygen-containing atmosphere is less than about 1000 ppm.

33. The process of claim 26 wherein the concentration of oxygen in the oxidizing ambient is between about 10 and about 100 ppm.

34. The process of claim 26 wherein each silicon wafer, after being cleaned, has a bulk copper concentration that is less than about $1\times10^9$ atoms/cm$^2$ and a concentration of light point defects greater than about 0.12 μm that is less than about 0.005 defects/cm$^2$.

35. A process for removing a contaminant selected from among copper, nickel, and a combination thereof from a silicon wafer having a silicon wafer surface and a silicon wafer interior, the process comprising:

increasing the temperature of the silicon wafer to an annealing temperature that is at least about 1100° C. while exposing the silicon wafer to a heating-cooling ambient comprising argon;

annealing the silicon wafer by exposing the silicon wafer to an annealing ambient selected from the group consisting of hydrogen, helium, neon, argon, krypton, xenon, and combinations for a duration that is between about 30minutes and about 90 minutes as the silicon wafer is at the annealing temperature to remove silicon oxide from the silicon wafer surface and to facilitate the migration of silicon atoms to exposed agglomerated vacancy defects at the silicon wafer surface thereby reducing the size of the exposed agglomerated vacancy defects;

decreasing the temperature of the silicon wafer from the annealing temperature to an oxidation initiation temperature that is no greater than about 800° C. while exposing the silicon wafer to the heating-cooling ambient;

exposing the silicon wafer to an oxidizing ambient comprising oxygen at a concentration that is between about 10and about 100ppm as the temperature of the wafer is decreased from the oxidation initiation temperature to form an oxide layer on the silicon wafer surface and a strain layer at an interface between the oxide layer and the silicon wafer interior;

controlling the temperature decrease of the silicon wafer to permit diffusion of atoms of the contaminant from the silicon wafer interior to the strain layer;

cleaning the silicon wafer to remove the contaminant that diffused to the strain layer from the silicon wafer.

36. The process of claim 35 wherein the annealing temperature is from about 1200to about 1250° C.,the wafer is exposed to the annealing ambient for about 60minutes, the oxidation initiation temperature is no greater than about 775° C. , and the temperature decrease of the silicon wafer is controlled so that silicon wafer temperature decreases at a rate that is between about 10and about 30° C. /minute from the oxidation initiation temperature to a temperature that is no greater than about 500° C.

37. The process of claim 1 further comprising heating the silicon wafer in an atmosphere consisting essentially of no oxidants prior to said cooling.

38. The process of claim 1 further comprising heating the silicon wafer to a temperature of at least about 1100° C. in an atmosphere consisting essentially of no oxidants prior to said cooling.

39. The process of claim 37 wherein the atmosphere consisting essentially of no oxidants consists essentially of a mono-atomic noble gas selected from the group consisting of helium, neon, argon, krypton, xenon, and mixtures thereof.

40. The process of claim 38 wherein the atmosphere consisting essentially of no oxidants consists essentially of a mono-atomic noble gas selected from the group consisting of helium, neon, argon, krypton, xenon, and mixtures thereof.

41. The process of claim 1 wherein the silicon wafer prior to said cooling is free of oxygen or oxide on its surface.

* * * * *